(12) United States Patent
Bhat

(10) Patent No.: US 12,690,309 B2
(45) Date of Patent: Jul. 21, 2026

(54) QUANTUM DOT CONTAINERS FOR MICRO-LED DISPLAYS

(71) Applicant: Tectus Corporation, Cupertino, CA (US)

(72) Inventor: Abhishek Deepak Bhat, Santa Clara, CA (US)

(73) Assignee: Tectus Corporation, Cupertino, CA (US)

( * ) Notice: Subject to any disclaimer, the term of this patent is extended or adjusted under 35 U.S.C. 154(b) by 3 days.

(21) Appl. No.: 18/961,183

(22) Filed: Nov. 26, 2024

(65) Prior Publication Data

US 2025/0126938 A1 Apr. 17, 2025

Related U.S. Application Data

(63) Continuation of application No. PCT/US2024/051464, filed on Oct. 15, 2024.

(60) Provisional application No. 63/590,526, filed on Oct. 16, 2023.

(51) Int. Cl.
| | |
|---|---|
| *H10H 20/85* | (2025.01) |
| *H10H 20/851* | (2025.01) |
| *H10H 20/855* | (2025.01) |
| *H10W 90/00* | (2026.01) |
| *B82Y 20/00* | (2011.01) |

(Continued)

(52) U.S. Cl.
CPC ...... *H10H 20/8514* (2025.01); *H10H 20/855* (2025.01); *H10W 90/00* (2026.01); *B82Y 20/00* (2013.01); *H10H 20/811* (2025.01); *H10H 20/812* (2025.01)

(58) Field of Classification Search
CPC ............. H10H 20/8514; H10H 20/855; H10H 20/8513; H10H 20/856; H10H 20/8512; H10H 20/811; H10H 20/812; H10N 90/00; B82Y 20/00
See application file for complete search history.

(56) References Cited

U.S. PATENT DOCUMENTS

| | | | |
|---|---|---|---|
| 2009/0289263 A1 | 11/2009 | Duong | |
| 2010/0065102 A1* | 3/2010 | Yuan ..................... | H01L 25/042 |
| | | | 136/244 |
| 2015/0268402 A1 | 9/2015 | An | |

(Continued)

FOREIGN PATENT DOCUMENTS

| | | | | |
|---|---|---|---|---|
| CN | 110752304 A | * | 2/2020 | ............. B82Y 30/00 |
| CN | 111029446 A | * | 4/2020 | ......... H10H 20/0133 |

(Continued)

OTHER PUBLICATIONS

PCT International Search Report and Written Opinion, PCT Application No. PCT/US2024/051464 dated Feb. 11, 2025, 15 pages.

(Continued)

*Primary Examiner* — Ida M Soward
(74) *Attorney, Agent, or Firm* — Fenwick & West LLP

(57) ABSTRACT

A color micro-LED display chip includes light-emitting diodes (LEDs) and quantum dot (QD) containers that contain quantum dots. The QD containers are positioned to receive light emitted from the LEDs. The QD containers are shaped to have an entrance face, an opposing exit face and a waist located between the two faces. The waist has an area that is less than an area of one of the faces and less than or equal to an area of the other face.

20 Claims, 8 Drawing Sheets

(51) Int. Cl.

| | | |
|---|---|---|
| *H10H 20/811* | (2025.01) | |
| *H10H 20/812* | (2025.01) | |

(56) References Cited

U.S. PATENT DOCUMENTS

| | | | | |
|---|---|---|---|---|
| 2021/0109617 A1* | 4/2021 | Lin | ....................... | H01L 25/167 |
| 2022/0020943 A1* | 1/2022 | Chung | ................. | H10K 59/351 |
| 2022/0149251 A1* | 5/2022 | Park | ................... | H10H 20/8514 |
| 2023/0117381 A1* | 4/2023 | Geng | ................ | H10H 20/8515 |
| 2023/0155076 A1* | 5/2023 | Fu | ...................... | H10H 20/8514 |
| | | | | 257/91 |
| 2023/0155079 A1 | 5/2023 | Kim | | |
| 2024/0243235 A1 | 7/2024 | Martin | | |
| 2025/0255142 A1* | 8/2025 | Kang | ................ | H10K 59/1201 |

FOREIGN PATENT DOCUMENTS

| | | | | | | |
|---|---|---|---|---|---|---|
| CN | 111090137 A | * | 5/2020 | ............. | G02B 5/008 |
| WO | WO-2016043988 A1 | * | 3/2016 | ........... | G02B 6/0066 |

OTHER PUBLICATIONS

Fabricating Quantum Dot Color Conversion Layers for Micro-LED Based Augmented Reality Displays, Lin et al., ACS Appl. Opt. Mater., 2024, 2, 1303-1313.

Full-color micro-LED display with photo-patternable and highly ambient-stable perovskite quantum dot/siloxane composite as color conversion layers, Shim et al., Nature Scientific Reports, 2023, 13, 4836.

* cited by examiner

Cylindrical Single Taper Double Taper

η=1.00 η= 1.06 η= 1.21

QUANTUM DOT CONTAINERS FOR MICRO-LED DISPLAYS

CROSS-REFERENCE TO RELATED APPLICATION(S)

This application is a continuation of International Application No. PCT/US2024/051464, "Quantum Dot Containers for Micro-LED Displays," filed Oct. 15, 2024; which claims priority to U.S. Provisional Patent Application Ser. No. 63/590,526, "Quantum Dot Container Geometry in Semiconductor Micro-LED Displays," filed Oct. 16, 2023. The subject matter of all of the foregoing is incorporated herein by reference in their entirety.

BACKGROUND

1. Technical Field

This disclosure relates generally to micro-LED displays, and more particularly to containers for color conversion materials (e.g., quantum dots) in such displays.

2. Description of Related Art

Displays are an important part of modern society. They are used in a wide range of devices such as TVs, smartphones, tablets, laptops, digital signage, and augmented reality and virtual reality devices. They are also used for many different applications, including entertainment, communication, education, and work. Displays can provide high-quality visual information, and they come in different sizes, resolutions, and formats to address different needs and preferences.

In particular, there is high demand for small, bright and efficient microdisplays, for example as can be used in small mobile devices. Micro-LED arrays are the basis of microdisplays featuring very small pixels arranged on a very small pixel pitch. Micro-LEDs may also be arranged on larger pixel pitches. Light emitted by micro-LEDs, and especially light subsequently converted to another color (e.g. in a quantum dot color converter), has a broad angular distribution. It may even approach a Lambertian distribution. It is important to collect the emitted light into the acceptance cone of the overall system.

BRIEF DESCRIPTION OF THE DRAWINGS

Embodiments of the disclosure have other advantages and features which will be more readily apparent from the following detailed description and the appended claims, when taken in conjunction with the examples in the accompanying drawings, in which:

DETAILED DESCRIPTION OF THE PREFERRED EMBODIMENTS

The figures and the following description relate to preferred embodiments by way of illustration only. It should be noted that from the following disclosure, alternative embodiments of the structures and methods disclosed herein will be readily recognized as viable alternatives that may be employed without departing from the principles of what is claimed.

Figure 1:
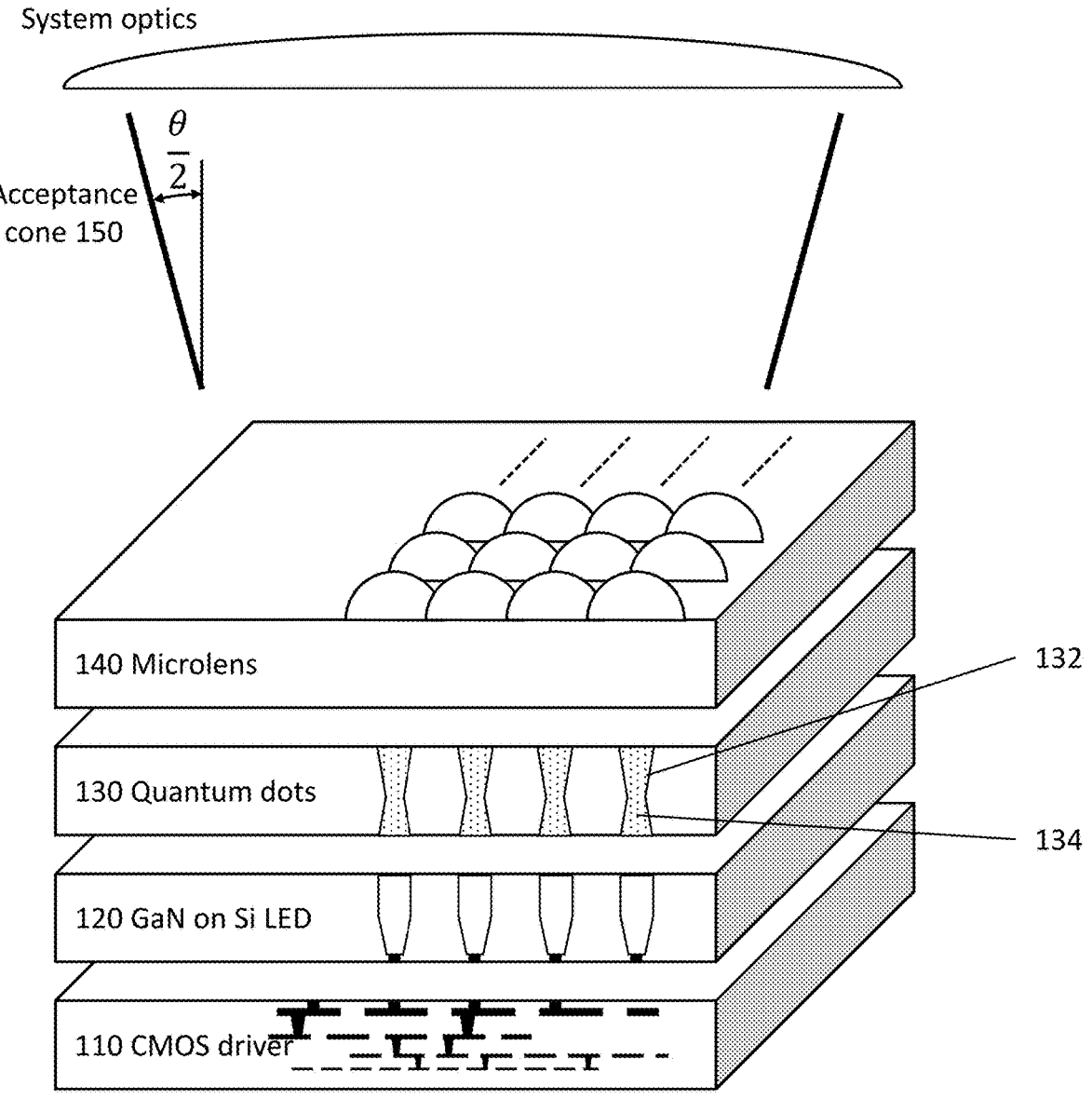
FIG. 1 is an exploded perspective view of a micro-LED display with a quantum dot (QD) color-conversion layer.

FIG. 1 is an exploded perspective view of a micro-LED display with a quantum dot (QD) color-conversion layer. From bottom to top, the display includes driver circuitry 110, micro-LEDs 120, quantum dot color conversion materials 130 and microlenses 140. In this example, the devices are supported by the silicon substrate for the CMOS drivers 110. An array of micro-LEDs 120 may be fabricated and the entire array connected to the driver circuitry 110, for example by hybrid bonding the LED wafer to the CMOS wafer. Alternatively, the micro-LEDs 120 may be picked and placed onto the silicon substrate 110.

In this example, the micro-LEDs 120 are all the same color. They may be gallium nitride blue LEDs. The color conversion materials 130 convert the light from the micro-LEDs 120 to different colors, for example to red and green for RGB displays. The micro-LEDs 120 and color conversion materials 130 form the emitters of FIG. 1. The different color emitters may be arranged into color pixels. In this example, the color conversion materials 130 are quantum dots. Other examples of color conversion materials include phosphors, quantum wires, and quantum plates.

As one example, a continuous LED layer (e.g., epitaxial layers) is first fabricated and then patterned into individual LEDs 120. In a micro-LED array, the light-emitting area of individual emitters may be less than about 5 um on a side (25 um$^2$ in area) or even as small as about 1 um (1 um$^2$ in area) or less. The pitch or lateral distance from an edge of an LED to the corresponding edge of the neighboring LED may also be less than about 5 um (microns), although micro-LEDs may also be arranged on larger pixel pitches.

The quantum dot color conversion layer 130 changes the color of the light emitted by the LEDs 120. For example, the QD layer 130 may convert blue light emitted by an LED into red light. The color conversion layer may be patterned into QD containers 132 which are aligned with the LEDs. In some cases, light emitted by different LEDs (or even adjacent LEDs) may be converted into different colors. This may be accomplished by filling QD containers 132 in the color conversion layer with different types of quantum dots 134. Some light emitters may not include color conversion, for example blue LEDs that produce the blue light component of color pixels.

The CMOS driver circuitry 110 receives digital signals representing the color pixels. The drivers 110 control the brightness of the micro-LEDs 120 by generating drive currents for the micro-LEDs based on the received digital signals. This controls the brightness and color of each color pixel. In this example, there is also one microlens 140 for each emitter. The microlens 140 collects light from the light emitter and couples it into the acceptance cone 150 (full angle θ) for the optics for the rest of the system.

Micro-LEDs, especially at very small sizes of 5 um or less, may be cylindrically symmetric. When a micro-LED display is viewed under high magnification, the individual LEDs may look like round dots. Accordingly, the containers which hold quantum dots may be designed as cylinders filled with quantum dots.

However, a cylinder may not be the optimal shape for QD containers in micro-LED display applications. On the contrary, container designs in which the cross-sectional area varies along the length of the container, may provide better performance. Even if the QD container is axially symmetric (i.e., the cross-section is always a circle), the diameter of the container may vary along its length. In one approach, the QD container may have a "waist." The waist is located between the two end faces of the QD container. The area of the waist is less than the area of one of the two end faces and less than or equal to the area of the other end face. In some designs, it may be less than the area of both end faces. One way that the shape of the QD container may increase the overall efficiency of the display is by coupling more light into the acceptance cone of the system. For example, augmented reality (AR) glasses and goggles use light directed into a specified acceptance angle, which may be as narrow as 30 to 40 degrees, full width. Light outside this acceptance cone will not be coupled into the rest of the system and will be wasted.

Figure 2A:
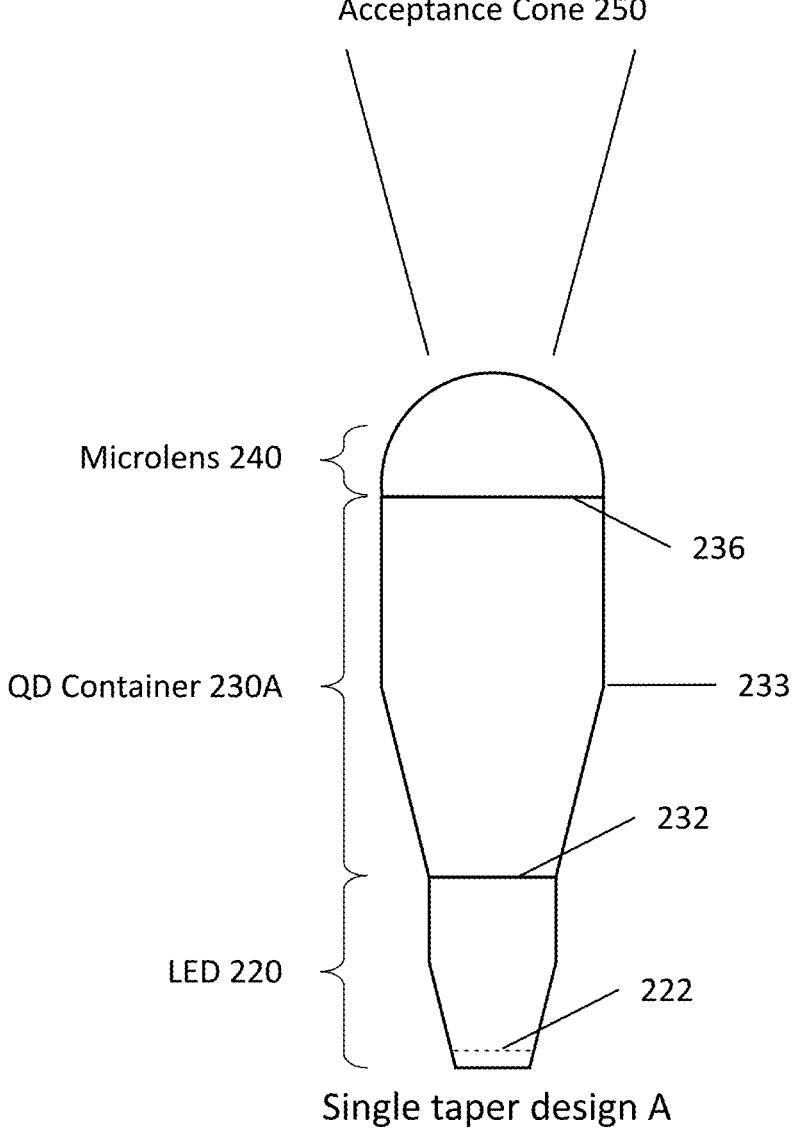
FIGS. 2A-2C are longitudinal sections showing QD containers of varying cross-sectional area.
Figure 2B:
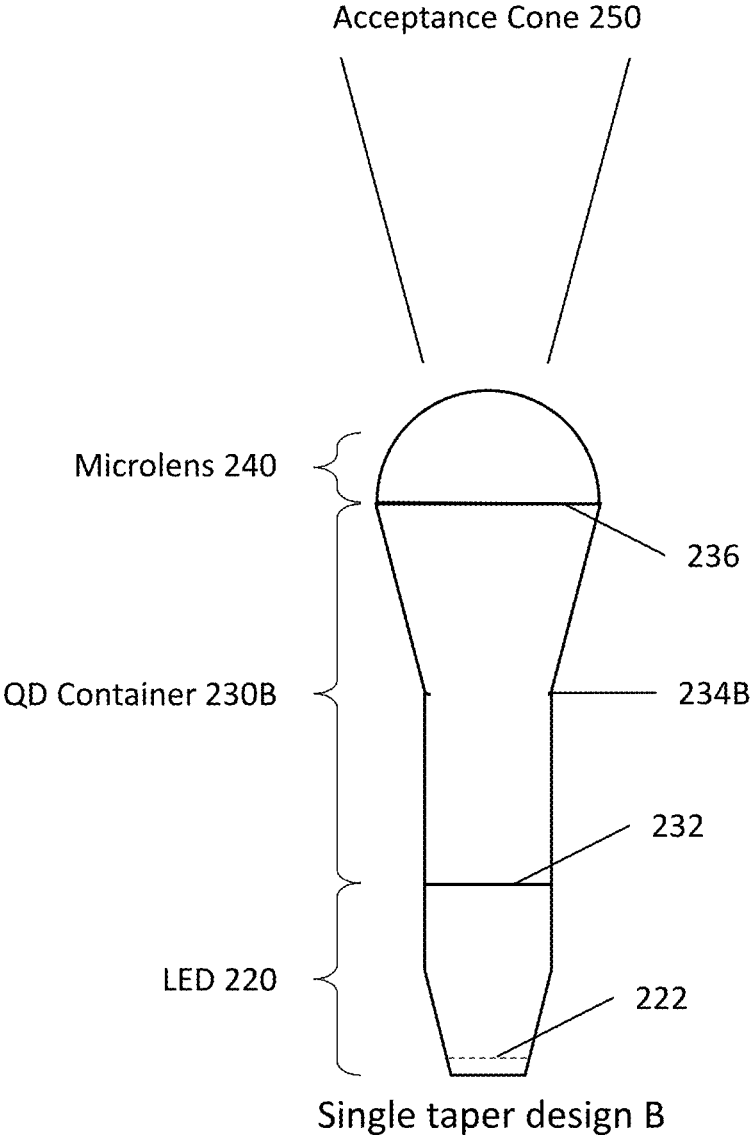
Figure 2C:
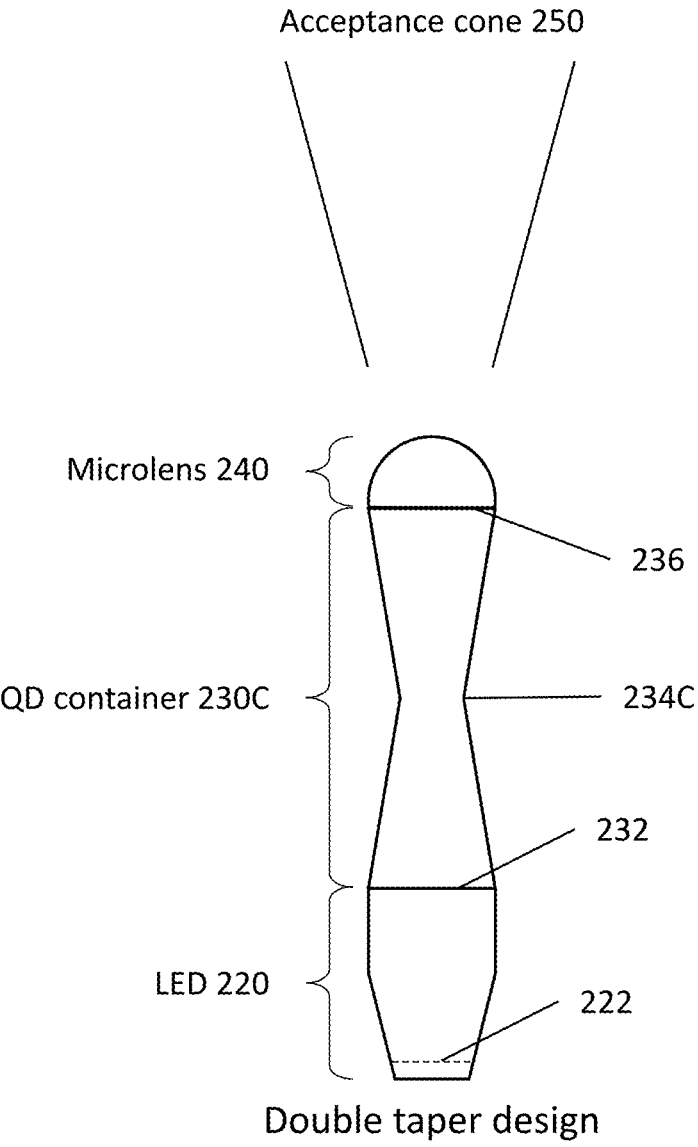

FIGS. 2A-2C are longitudinal sections showing QD containers of varying cross-sectional area. From bottom to top, these figures show an LED 220 with active region 222, QD container 230, and microlens 240. The designs shown couple light into an acceptance cone 250 for the system. These are each axially symmetric designs, with diameters that vary along the length of the QD containers.

The QD container 230 includes an entrance face 232, a waist 234 (in some figures) and an exit face 236. The LED 220 abuts the entrance face 232 of the QD container. Light from the LED 220 enters the QD container 230 through the entrance face 232 and exits through the exit face 236 to the microlens 240. FIG. 2A shows one single taper design, FIG. 2B shows another single taper design, and FIG. 2C shows a double taper or hourglass design. In the single taper design of FIG. 2A, the container increases in cross-sectional area from entrance face 232 to inflection point 233, and then has constant cross-sectional area from inflection point 233 to exit face 236. This design does not have a waist since there is no cross section between the two end faces 232, 236 where the cross section has area less than the area of one of the end faces and less than or equal to the area of the other end face.

The single taper design of FIG. 2B does have a waist 234B. The waist 234B has the same area as one of the faces (entrance face 232 in this example) and is smaller in area than the other face (exit face 236). There is one taper from face 236 to the waist 234B. The container has constant cross-sectional area between the waist 234B and face 232. In the double taper design of FIG. 2C, the waist 234C has a smaller area than both faces 232, 236. There are two tapers, one from face 232 to waist 234C and one from face 236 to waist 234C.

The tapers in FIGS. 2A-2C are shown as straight sidewalls between waist 234 and face 232, 236. For circular cross-sections, the diameter of the circle increases linearly along the length of the container away from the waist 234 (or inflection point 233). However, this is not required. The diameter may increase monotonically, but not linearly, for example. In some designs, the cross-sections all have the same shape (e.g., all circles), regardless of how the area increases with length.

Figure 3:
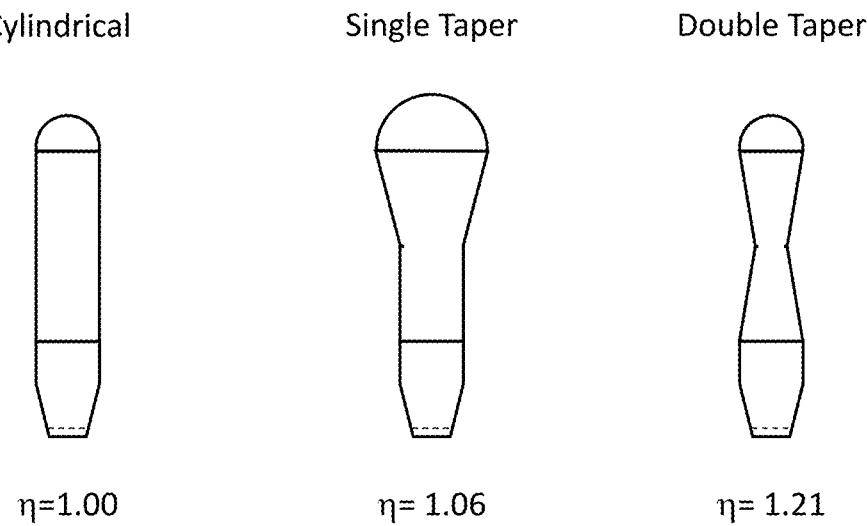
FIG. 3 lists figures of merit for various QD container geometries.

FIG. 3 shows example figures of merit for various QD container geometries. The left stack shows a cylindrical QD container. The performance of this stack is normalized to η=1. For example, the performance might be 1% "wall-plug" efficiency (light power out divided by electrical power in). Under the same conditions, the performance of the single taper geometry shown is η=1.06 or 6% better than the cylindrical geometry. The performance of the double taper geometry is η=1.21, or 21% better.

These results may be counterintuitive. However, the performance of an emitter stack is a complicated function of factors ranging from LED quantum efficiency to quantum dot parameters to optical path design. The LEDs emit light according to a given angular distribution, and the quantum dots absorb and re-emit light according to another angular distribution. The QD containers may be partly filled or fully filled with quantum dots. Some QD containers may be empty or some light emitters may not even have QD containers, for example if color conversion is not required for that light emitter. The QD containers also may or may not have different sizes and shapes, particularly for different types of quantum dots. Overall performance is determined by coupling from the LED into the quantum dots, from the quantum dots into the microlens, and from the microlens into the acceptance cone. Changing the cross-sectional areas may increase one of these couplings while decreasing another. Thus, tradeoffs are made in the overall system design to produce overall better system performance. Axially symmetric, tapered geometries for the QD container in a micro-LED pixel consistently give different, and often significantly better, results than straightforward cylindrical QD container shapes.

Figure 4:
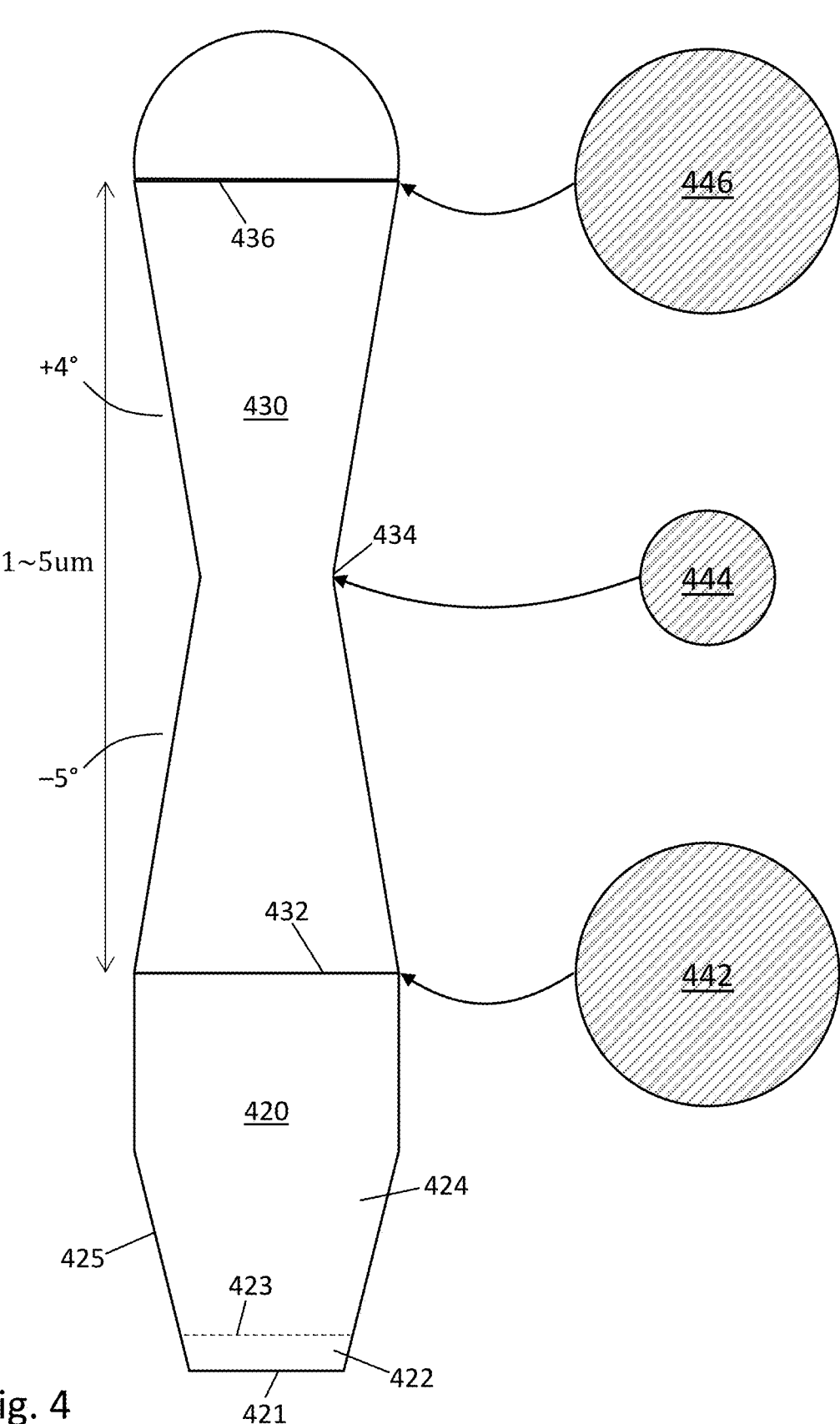
FIG. 4 is a longitudinal section showing a QD container with an hourglass shape.

FIG. 4 is a longitudinal section showing a QD container with an hourglass geometry (double taper design). In the example of FIG. 4, the length of the QD container 430 may be about 1-5 um. The length of the LED 420 is about 1-10 um. The taper from the entrance face 432 to the waist 434 is about −8 to −5 degrees away from a cylindrical sidewall. The taper from the waist 434 to the exit face 436 is about +6 to +4 degrees away from a cylindrical sidewall. The length of the QD container and its sidewall angles may be adjusted and optimized to achieve best performance for a given set of parameters. In some designs, the taper of the sidewall may lie in the range of −25 to +25 degrees. The example of FIG. 4 is one design. In actual fabrication, the diameter may not increase linearly along the length of the container.

FIG. 4 also shows the cross-sectional area at various points along the length of the QD container. Cross-sectional area 442 is for the entrance face 432, cross-sectional area 444 is for the waist 434, and cross-sectional area 446 is for the exit face 436. Here, the cross-sectional areas are all circles. However, they could be other shapes, such as squares, rectangles or other polygons. The areas 442, 444, 446 at the two end faces and waist may be different in size, but similar in shape. The largest cross-sectional area may be about 1-5 um in size. The length/width aspect ratio of the QD container may range from about 0.5:1 to 10:1, or from about 1:1 to 5:1.

In FIG. 4, the LED 420 also has an angled sidewall. The LED 420 uses a combination of a half cavity and sloped, straight reflective sidewalls to improve the power distribution. From the bottom upwards, the LED 420 includes a reflector 421, a thinner p-layer 422 and a thicker n-layer 424. An active region (such as a quantum well region) 423 between the n-layer and the p-layer generates light. The bottom reflector 421 and p-layer 422 form a half cavity for the light emitted from the active region. This alters the angular power distribution. Straight reflective sidewalls 425 extending at an angle from the active region upwards into the n-layer further reflect light from the altered power distribution into the QD container 430. For example, see U.S. Pat. No. 11,127,881, which is incorporated by reference herein.

Figure 5A:
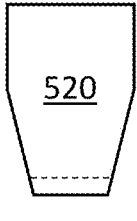
FIGS. 5A-5E illustrate fabrication of a QD container with an hourglass shape.
Figure 5D:
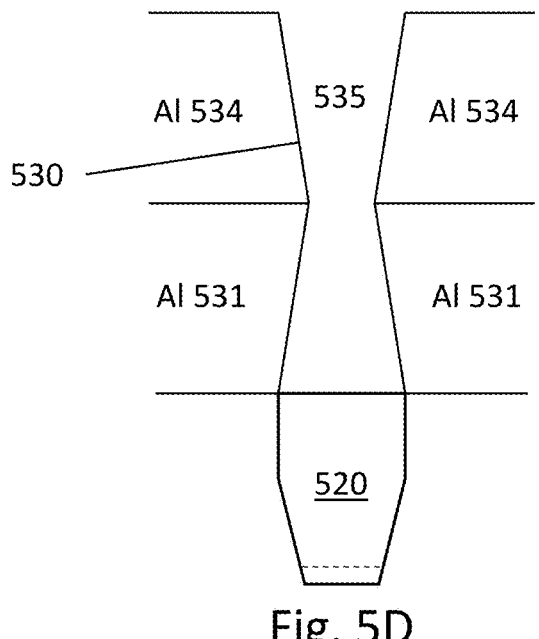
Figure 5B:
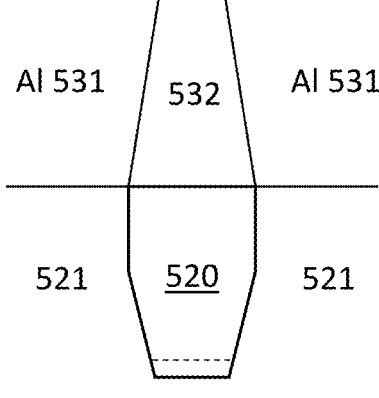

FIGS. 5A-5E show a process for fabricating an hourglass QD container. FIGS. 5A-5E are all longitudinal sectional views. FIG. 5A shows an LED 520 patterned in a GaN-epi wafer. In FIG. 5B, an aluminum layer 531 has been deposited and patterned over the LED layer 520,521. Other metals or materials such as polysilicon may be used as alternatives. The aluminum is patterned to open a hole 532 above the LED 520. This may be done with an inductively-coupled plasma reactive ion etch (ICP RIE). The diameter of the hole 532 decreases with distance away from the LED. This effect may be obtained through choice of RIE operating parameters such as energy and chemistry.

Figure 5C:
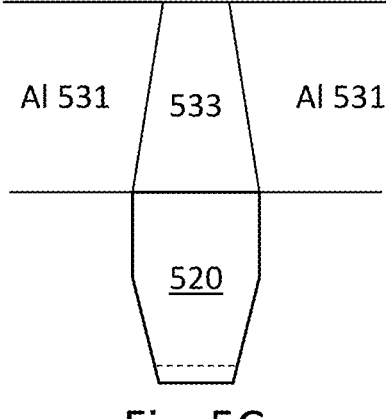
Figure 5E:
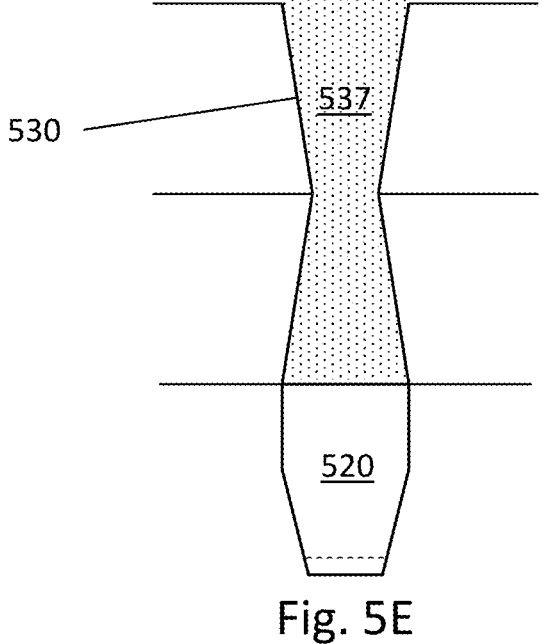

In FIG. 5C the hole made in FIG. 5B has been filled 533 and covered with, for example, silicon oxide, silicon nitride or benzocyclobutene (BCB). The fill overburden is removed via chemical-mechanical polishing to leave a flat surface at the level of the aluminum layer 531. A second aluminum layer 534 is patterned on this surface, as shown in FIG. 5D. This time, the RIE parameters are changed so that the diameter of hole 535 increases with distance away from the LED. The fill 533 remaining from the step shown in FIG. 5C is then removed, for example with a selective wet etch. This produces a QD container 530 with an hourglass shape. FIG. 5E shows the result of filling the QD container 530 with quantum dots 537 after the fill has been removed. The result is quantum dots contained in a QD container with the hourglass taper geometry.

Axially symmetric QD containers having varying diameter profiles provide better performance in many cases. Even small performance improvements may be commercially significant. For example, a 20% improvement in "wall-plug" efficiency is equivalent, all other things being equal, to a 20% improvement in battery life which is an important factor in wearable displays such as watches and augmented reality glasses.

Figure 6A:
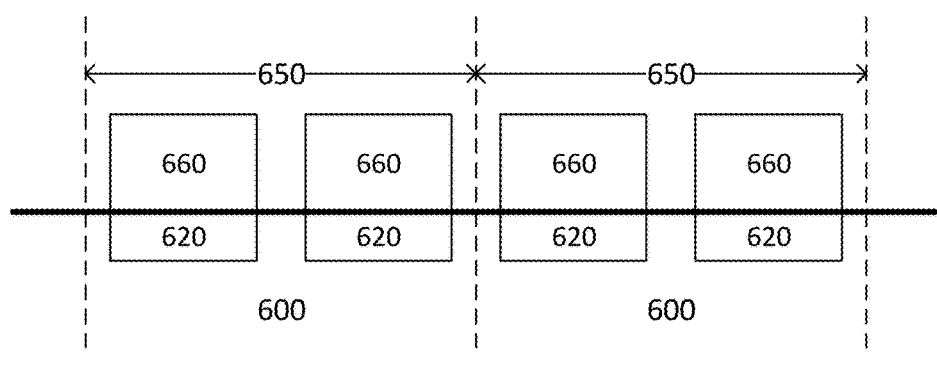
FIGS. 6A and 6B are a cross-sectional side view and an exploded perspective view of a display with an array of color pixels.
Figure 6B:
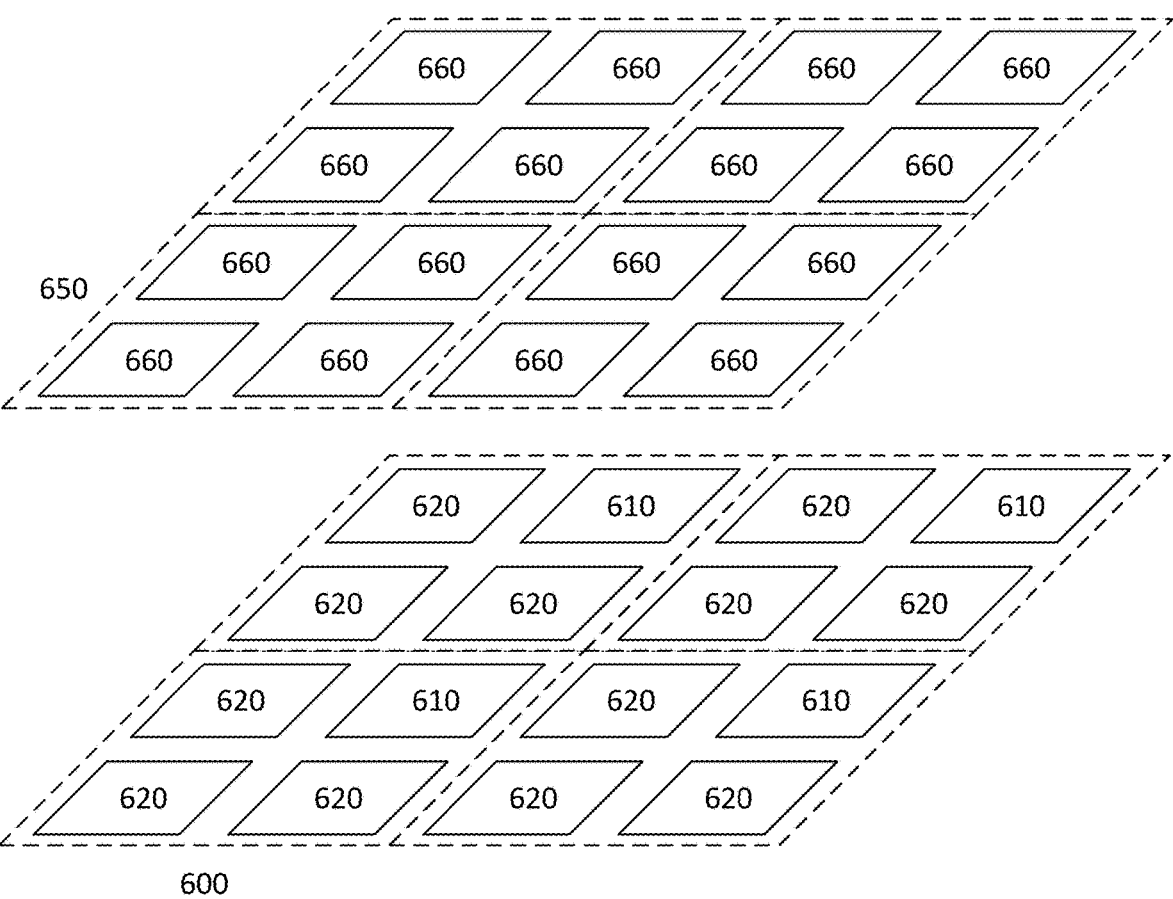

FIGS. 2-5 show individual emitters. A display includes an array of color pixels, each with multiple emitters. FIGS. 6A and 6B are a cross-sectional side view and an exploded perspective view of a display with an array of color pixels 650. For clarity, FIG. 6B shows the footprints of various components, but without any thickness. The top plane of FIG. 6B is the LED frontplane, and the bottom plane is the CMOS driver backplane.

FIGS. 6A-6B show a 2×2 array of color pixels, as indicated by the dashed lines. In this example, the display is a color display and each color pixel includes a 2×2 array of micro-LEDs 660 that provide red, green and blue subpixels. Each subpixel includes one or more separately controllable micro-LEDs. This example uses a pattern of two red (R), one blue (B), and one green (G) light emitter per color pixel. This could be implemented by using micro-LEDs with color conversion materials as described previously. Other patterns may also be used.

The pixel driver 600 for each color pixel includes three driver circuits 620 for the three colors and may include a corresponding local memory 610. One driver circuit 620 drives the LED for the red subpixel, one drives the LED for the blue subpixel and one drives the two LEDs for the green subpixel. The backplane area for each color pixel is divided into quadrants, with the three driver circuits 620 located in three of the quadrants and the local memory 610 located in the fourth quadrant. With this arrangement, the pixel driver circuitry does not occupy more area than the micro-LEDs. In this particular example, the driver circuits 620 and local memory 610 for each color pixel are positioned under the micro-LEDs for that pixel.

The arrangement shown in FIGS. 6A-6B is just one example. Other arrangements will be apparent. For example, the micro-LEDs may be arranged as stripes, in hexagonal arrays or other geometries. There may also be different combinations of different colors or other different types of LEDs. Different arrangements of micro-LEDs to color subpixels may also be used. The driver circuits also may be arranged as stripes or in other geometries. The circuits for different subpixels and pixels may not be physically segregated as shown in FIGS. 6A-6B. The different instances of the circuits may also be rotated or flipped in orientation. These variations may be used to facilitate routing of circuit interconnects or sharing of common components. For example, the backplane circuitry for each individual pixel may not be the same shape as the area occupied by the light emission layer. The arrangement of backplane and light emission layer may use multi-pixel building blocks, for example repeating 2×2 or larger arrays of pixels.

Although the detailed description contains many specifics, these should not be construed as limiting the scope of the invention but merely as illustrating different examples. It should be appreciated that the scope of the disclosure includes other embodiments not discussed in detail above. Various other modifications, changes and variations which will be apparent to those skilled in the art may be made in the arrangement, operation and details of the method and apparatus disclosed herein without departing from the spirit and scope as defined in the appended claims. Therefore, the scope of the invention should be determined by the appended claims and their legal equivalents.

What is claimed is:

1. A color micro-LED display chip comprising:
a plurality of light-emitting diodes (LEDs); and
a plurality of quantum dot (QD) containers positioned to receive light emitted from the plurality of LEDs, the plurality of QD containers shaped to have two faces and a waist located between the two faces, the two faces comprising an entrance face and an exit face opposing the entrance face, the waist having a cross-sectional area that is less than a cross-sectional area of a first face of the two faces and less than or equal to a cross-sectional area of a second face of the two faces.

2. The color micro-LED display chip of claim 1 wherein the cross-sectional area of the waist is less than the cross-sectional area of the first face and equal to the cross-sectional area of the second face.

3. The color micro-LED display chip of claim 2 wherein the cross-sectional area of the waist is less than the cross-sectional area of the exit face and equal to the cross-sectional area of the entrance face.

4. The color micro-LED display chip of claim 2 wherein the plurality of QD containers have a constant cross-sectional area between the waist and the face with the equal cross-sectional area.

5. The color micro-LED display chip of claim 1 wherein, for each face with cross-sectional area greater than the cross-sectional area of the waist, the plurality of QD containers have a monotonically increasing cross-sectional area from the waist to the face with cross-sectional area greater than the cross-sectional area of the waist.

6. The color micro-LED display chip of claim 5 wherein, for each face with cross-sectional area greater than the cross-sectional area of the waist, the plurality of QD containers have straight, tapered sidewalls between the waist and the face with cross-sectional area greater than the cross-sectional area of the waist.

7. The color micro-LED display chip of claim 1 wherein the entrance face, waist and exit face all have a same shape.

8. The color micro-LED display chip of claim 7 wherein all cross sections of the plurality of QD containers along a length of the plurality of QD containers have the same shape.

9. The color micro-LED display chip of claim 1 wherein the plurality of QD containers are axially symmetric with circular cross-section.

10. The color micro-LED display chip of claim 9 wherein a diameter of the circular cross-section is constant from the entrance face to the waist, and then increasing from the waist to the exit face.

11. The color micro-LED display chip of claim 9 wherein a diameter of the circular cross-section is decreasing from the entrance face to the waist, and then increasing from the waist to the exit face.

12. The color micro-LED display chip of claim 1 further comprising: quantum dots contained in the plurality of QD containers, the quantum dots converting light from the plurality of LEDs to a different color.

13. The color micro-LED display chip of claim 12 wherein the plurality of QD containers are only partly filled with quantum dots.

14. The color micro-LED display chip of claim 1 wherein the entrance faces of the plurality of QD containers abut the plurality of LEDs emitting light into the plurality of QD containers.

15. The color micro-LED display chip of claim 1 wherein the plurality of LEDs and the plurality of QD containers are supported by a single substrate.

16. The color micro-LED display chip of claim 1 wherein the plurality of LEDs and the plurality of QD containers are two stacked layers.

17. A color micro-LED display chip comprising:

a plurality of light-emitting diodes (LEDs); and a plurality of quantum dot (QD) containers positioned to receive light emitted from the plurality of LEDs, the plurality of QD containers shaped to have two faces and a waist located between the two faces, the two faces comprising an entrance face and an exit face opposing the entrance face, where an area of the waist is less than an area of either of the two faces.

18. A color micro-LED display comprising:

a plurality of light emitters of different colors arranged into individually addressable color pixels, the plurality of light emitters comprising:

light-emitting diodes (LEDs);

quantum dot (QD) containers positioned to receive light emitted from the LEDs, the QD containers shaped to have two faces and a waist located between the two faces, the two faces comprising an entrance face and an exit face opposing the entrance face, the waist having an area that is less than an area of a first face of the two faces and less than or equal to an area of a second face of the two faces; and quantum dots contained in the QD containers, the quantum dots converting light received from the LEDs to a different color; and CMOS driver circuits that receive digital signals representing the color pixels to be displayed, the CMOS driver circuits driving the LEDs according to the digital signals; and microlenses positioned to collect light from the QD containers.

19. The color micro-LED display of claim 18 wherein the LEDs all emit light of a same color, and the quantum dots convert light from the LEDs to other colors in the color pixels.

20. The color micro-LED display of claim 18 wherein the color micro-LED display produces light for a system characterized by an acceptance cone, and the plurality of light emitters couple more light into the acceptance cone compared to the plurality of light emitters with QD containers without waists.

* * * * *